United States Patent
Espinoza-Ibarra et al.

(10) Patent No.: US 8,597,091 B2
(45) Date of Patent: Dec. 3, 2013

(54) SYSTEM FAN MANAGEMENT BASED ON SYSTEM LOADING OPTIONS FOR A SYSTEM HAVING REPLACEABLE ELECTRONICS MODULES

(75) Inventors: Ricardo Espinoza-Ibarra, Lincoln, CA (US); Andrew H. Barr, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 2592 days.

(21) Appl. No.: 11/191,052

(22) Filed: Jul. 28, 2005

(65) Prior Publication Data

US 2005/0259395 A1    Nov. 24, 2005

Related U.S. Application Data

(62) Division of application No. 10/631,696, filed on Jul. 31, 2003, now Pat. No. 6,961,242.

(51) Int. Cl.
*H05K 7/10* (2006.01)
*H05K 7/20* (2006.01)

(52) U.S. Cl.
USPC .......................................... 454/184; 361/695

(58) Field of Classification Search
USPC .......................................... 454/184; 361/695
See application file for complete search history.

(56) References Cited

U.S. PATENT DOCUMENTS

| | | | |
|---|---|---|---|
| 4,495,986 A | 1/1985 | Clark et al. | |
| 4,815,527 A | 3/1989 | Meckler | |
| 4,948,040 A * | 8/1990 | Kobayashi et al. | 236/49.3 |
| 5,121,291 A | 6/1992 | Cope et al. | |
| 5,249,741 A * | 10/1993 | Bistline et al. | 236/49.3 |
| 5,279,609 A | 1/1994 | Meckler | |
| 5,471,099 A * | 11/1995 | Larabell et al. | 307/53 |
| 5,691,883 A | 11/1997 | Nelson | |
| 5,761,085 A | 6/1998 | Giorgio | |
| 5,772,501 A | 6/1998 | Merry et al. | |
| 5,796,580 A * | 8/1998 | Komatsu et al. | 361/679.48 |
| 6,041,850 A | 3/2000 | Esser et al. | |
| 6,101,459 A * | 8/2000 | Tavallaei et al. | 702/132 |
| 6,104,003 A | 8/2000 | Jones | |
| 6,268,664 B1 * | 7/2001 | Rolls et al. | 307/32 |
| 6,414,845 B2 * | 7/2002 | Bonet | 361/695 |
| 6,446,026 B1 * | 9/2002 | Dean et al. | 702/182 |

(Continued)

FOREIGN PATENT DOCUMENTS

JP    11-274776    10/1999
JP    11274776 A * 10/1999

OTHER PUBLICATIONS

Great Britain Search Report. Application No. GB0416957.9. Dec. 9, 2004.

*Primary Examiner* — Steven B McAllister
*Assistant Examiner* — Frances H Kamps

(57) ABSTRACT

An electronic system has independently coolable first and second zones. The electronic system includes a first zone having a first zone fan and a plurality of first zone connectors for connecting electronic modules and a second zone having a second fan zone and a plurality of second zone connectors for connecting electronic modules. A module manager is also provided for communicating with the first and second zone connectors and with the first and second zone fans. The module manager can independently control the speed of the first and second zone fans based upon operational parameters received from the first and second zone connectors.

28 Claims, 2 Drawing Sheets

(56) References Cited

U.S. PATENT DOCUMENTS

| | | | |
|---|---|---|---|
| 6,522,546 B1 * | 2/2003 | Boyer et al. | 361/720 |
| 6,574,104 B2 | 6/2003 | Patel et al. | |
| 6,597,972 B2 | 7/2003 | Emberty et al. | |
| 6,628,520 B2 * | 9/2003 | Patel et al. | 361/696 |
| 6,654,241 B2 * | 11/2003 | Hillyard et al. | 361/679.48 |
| 6,750,562 B2 * | 6/2004 | Rolls et al. | 307/32 |
| 6,836,849 B2 * | 12/2004 | Brock et al. | 713/310 |
| 6,859,882 B2 * | 2/2005 | Fung | 713/300 |
| 6,876,549 B2 * | 4/2005 | Beitelmal et al. | 361/692 |
| 6,924,977 B2 * | 8/2005 | Bestwick et al. | 361/679.51 |
| 7,112,131 B2 * | 9/2006 | Rasmussen et al. | 454/184 |
| 7,428,655 B2 * | 9/2008 | Pomaranski et al. | 714/3 |
| 7,500,911 B2 * | 3/2009 | Johnson et al. | 454/184 |
| 7,548,971 B2 * | 6/2009 | Espinoza-Ibarra et al. | 709/224 |
| 2003/0030978 A1 * | 2/2003 | Garnett et al. | 361/687 |
| 2003/0161101 A1 | 8/2003 | Hillyard et al. | |
| 2003/0173830 A1 * | 9/2003 | Smith et al. | 307/117 |

* cited by examiner

SYSTEM FAN MANAGEMENT BASED ON SYSTEM LOADING OPTIONS FOR A SYSTEM HAVING REPLACEABLE ELECTRONICS MODULES

RELATED APPLICATIONS

The present application is a divisional application of commonly-owned U.S. patent application Ser. No. 10/631,696 entitled "SYSTEM FAN MANAGEMENT BASED ON SYSTEM LOADING OPTIONS FOR A SYSTEM HAVING REPLACEABLE ELECTRONICS MODULE," naming as inventors Ricardo Espinoza-Ibarra and Andrew H. Barr, filed on Jul. 31, 2003 now U.S. Pat. No. 6,961,242, and which is hereby incorporated by reference herein in its entirety.

BACKGROUND OF THE INVENTION

1. Field of the Invention

The present invention relates generally to system fan management for cooling an electronic system and, more particularly, to automatically managing cooling fan operation based upon the configuration of replaceable electronic modules within zones of such an electronic system.

2. Related Art

Advances in the miniaturization of computer, communication and other electronic equipment have led to the development of so-called "blade" systems, which permit several circuit boards ("blades") to be installed in a single chassis. The chassis typically includes components, such as power supplies, cooling fans, a blade manager, and other components that are shared by all the blades installed in the chassis. The blades typically plug into a backplane of the chassis, which distributes power and data signals between the blades, blade manager, and other components. This arrangement enables a large number of blades to be housed in a relatively small chassis. Oftentimes, the chassis is dimensioned to be mounted in a rack, such as a server rack with other rack-mounted equipment.

Blades are typically designed to be "hot swappable", that is, they can be installed into or removed from a chassis without removing power from all components in the chassis. This enables an operator or system manager to replace a failed or failing blade with a replacement blade without adversely affecting real-time operations of other chassis components. In addition, spare blades can be installed in a chassis, without activating them, to serve as "standby" blades.

Blades can perform various functions. Most blades contain entire computers, including single or multiple processors, memory, and network interfaces. Most computer blades are used as servers while others are used as communication devices, such as routers, firewalls or switches. Some blades contain specialized hardware components, in addition to or instead of processors, memory, etc. Typically, any type of blade can be plugged into any slot of a chassis. This enables an operator or system manager to "mix and match" blades in a chassis so that requisite operations can be performed by the blade system. In addition, the mixture of blade types can be changed to accommodate changes in operational requirements.

Some server blades include disk drives. Other blades access disk drives that are located elsewhere in the chassis or are connected to the chassis by computer network hardware. The blade manager establishes logical network connections between these blades and off-blade disk drives. Since these blades can be connected to different disk drives containing different software at different times, these blades can execute different operating systems and/or application programs, and can access different data at different times. For example, a system operator might choose to logically connect a blade to different disk drives to execute different application programs at different times of a day. In another example, if a blade fails, logical connections from off-blade disk drives that were formerly used by the failed blade can be redirected to a replacement or hot standby blade.

Some blades can be field-upgraded, such as by installing additional memory, processors or other components on the blades. In contrast, some manufacturers prefer to produce blades that are fully populated with such additional hardware. These manufacturers selectively enable or disable the additional hardware when the blades are manufactured, to tailor the blade capabilities to the customers' initial needs and budgets. Later, if a customer purchases a license to upgrade a blade, all or a portion of the additional hardware can be enabled without reconfiguring (which requires removal of the blade from the chassis) or replacing the blade.

Though blade servers provide many advantages, several engineering challenges arise when using bladed servers. Among these challenges is the challenge of designing and operating a bladed system such that the heat generated by the blades is sufficiently removed in the limited space available in the chassis that hosts the system. Some known power limiting strategies include powering down a CPU functional unit, e.g., a floating point unit or an on-die cache, or trading off speed for reduced power consumption in a hard drive. To address heat dissipation challenges, bladed server systems can be designed with an underlying power and thermal envelope. For example, when a chassis that hosts a bladed system has a limited amount of airflow available to cool the blades (i.e., when the system can only dissipate a limited amount of heat), then the chassis is designed for a limited amount of power consumption and an associated limited performance of the blades.

As a result of the modularity and flexibility of such bladed systems however, different portions of a chassis that holds the blades may contain more or fewer blades, blades that run hotter than other blades, blades with processors that run at different clock frequencies than processors on other blades, and/or blades that have been turned on or turned off during operation of the bladed system. As a result, the cooling needs within a particular chassis can vary from time to time, and, in particular, the cooling needs of more than one cooling region within the blade chassis (each cooling region served by one or more separate cooling fans) can vary from time to time. In order to optimize the usage of available power in a bladed system, previous systems have changed the speed of all of the fans in a chassis together, without regard to the location of individual fans in the chassis, based on system parameters such as temperature within the chassis.

SUMMARY OF THE INVENTION

In one aspect of the invention, an electronic system having independently coolable first and second zones is provided. The electronic system includes a first zone having a first zone fan and a plurality of first zone connectors for connecting electronic modules and a second zone having a second fan zone and a plurality of second zone connectors for connecting electronic modules. A module manager is also provided for communicating with the first and second zone connectors and with the first and second zone fans. The module manager can independently control the speed of the first and second zone fans based upon operational parameters received from the first and second zone connectors.

In a further aspect of the invention, a method for cooling an electronic system is provided. The electronic system has a module manager and a plurality of replaceable electronic modules provided in a plurality of zones with each zone having an independently controllable cooling fan. In the method, the module manager receives one or more operational parameters from the first zone of the electronic system, and one or more operational parameters from a second zone of the electronic system. The module manager then calculates a desired speed for a cooling fan associated with the first zone of the electronic system and provides a control signal indicating the desired speed to the cooling fan associated with the first zone. The module manager further calculates a desired speed for a cooling fan associated with the second zone of the electronic system and provides a control signal indicating the desired speed to the cooling fan associated with the second zone.

In a still further aspect of the invention, a module manager for independently controlling a first zone fan for cooling a first zone of an electronic system and a second zone fan for cooling a second zone of the electronic system is provided where the electronic system has a plurality of replaceable electronic modules. The module manager includes a first receiver configured to receive one or more operational parameters from the first zone of the electronic system and a second receiver configured to receive one or more operational parameters from the second zone of the electronic system. The module manager also includes a calculator configured to calculate a first control signal for controlling the first zone fan based on the one or more operational parameters received from the first zone of the electronic system and a second control signal for controlling the second zone fan based on the one or more operational parameters received from the second zone of the electronic system. The module manager further includes a communicator configured to communicate the first and second control signals to the first and second fans, respectively.

DETAILED DESCRIPTION

The present invention provides methods and systems to automatically manage cooling fan operating conditions in different zones within an electronic system based upon the configuration of replaceable electronic modules within the electronic system. The electronic system includes a number of connectors for connecting replaceable electronic modules in at least two zones with each zone having a separate cooling fan. An electronic module manager (hereinafter "module manager") communicates with the connectors to determine whether any electronic modules are connected, and if electronic modules are connected, to optionally determine operating parameters of the electronic modules that relate to the modules' cooling requirements. The module manager then controls the speed of each cooling fan independently according to the cooling requirements of the electronic modules present in a particular zone.

Replaceable electronic modules include blades; circuit boards that connect to other circuits by plugs, sockets, soldered wire connections or any other conventional electrical connection; "daughter" boards; integrated circuits; monitors; and any electronic component, circuit or subsystem (hereinafter, electronic module) that can be connected to other modules, as long as the modules can be initially connected to the other modules or they can be disconnected from their respective modules and the same or replacement modules can be connected in their places. For purposes of providing an example, the present invention will be described in the context of a blade system. As noted, a blade system is a printed circuit board (called the backplane or midplane), which is installed in a chassis along with a plurality of other printed circuit boards, or blades, that plug into it. In such a system, blades can fail and be replaced by replacement blades. The failed blades can be left in, or removed from, the blade system. In addition, blades can be replaced for reasons other than blade failure, such as to facilitate blade testing. One of ordinary skill in the art can, however, apply the teachings herein to other types of modules, including but not limited to those listed above.

Figure 1:
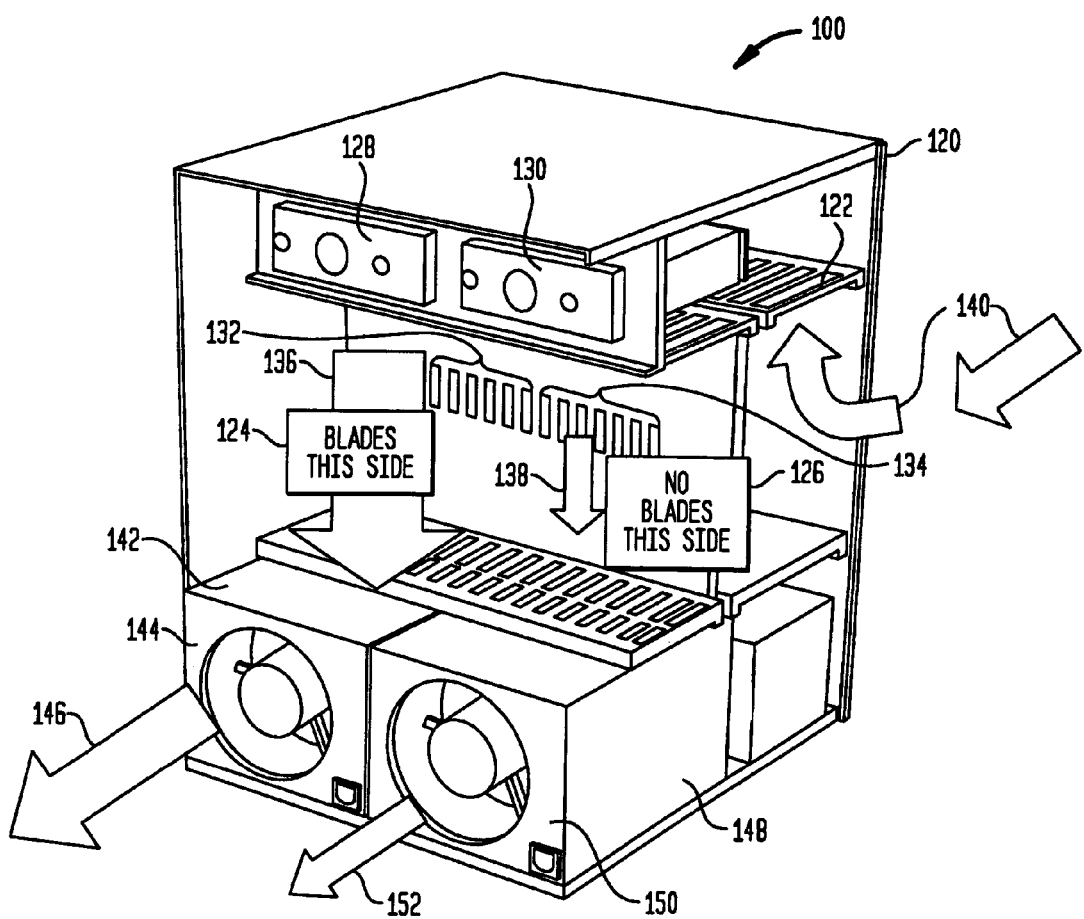
FIG. 1 is a perspective view of an electronic system of the invention.
Figure 2:
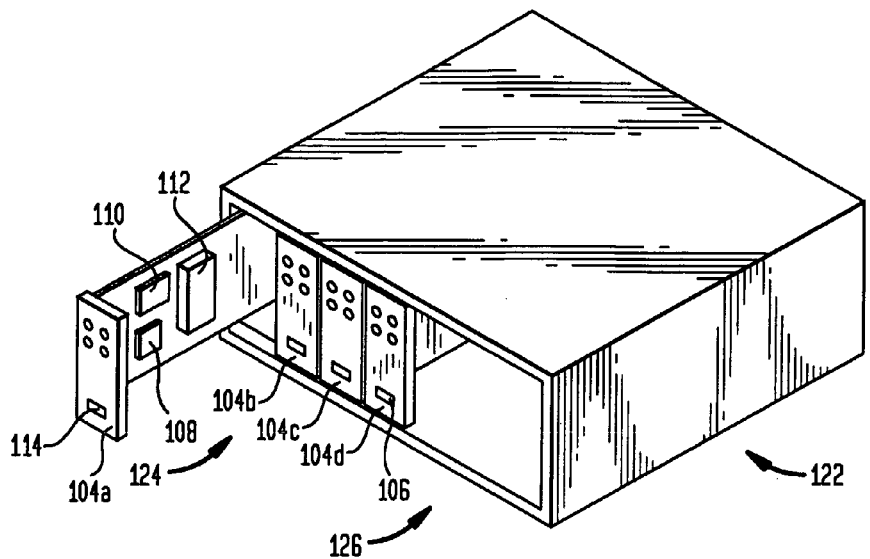
FIG. 2 is a perspective view of an exemplary blade system, in which aspects of the present invention can be implemented.

FIG. 1 illustrates an exemplary electronic system 100 of the invention having a chassis frame 120 holding at least one chassis 122 for further holding replaceable electronic modules in at least two zones: a first zone 124 and a second zone 126. In order to view other details of chassis frame 120, replaceable electronic modules have not been illustrated in FIG. 1, but rather first zone 124 (the left zone) has been labeled as having blades connected to first zone connectors 132 and second zone 126 (the right zone) has been labeled as having no blades connected to second zone connectors 134. FIG. 2 provides an illustration of a chassis 122 in which blades 104 are illustrated and, as labeled in FIG. 1, blades 104 are provided in first zone 124, while no blades are provided in second zone 126.

Electronic system 100 of FIG. 1 further includes a first zone fan 128, which creates a first zone air flow 136, and a second zone fan 130, which creates a second zone air flow 138, with both fans pulling air from a cooling air input flow 140. First zone air flow 136 is illustrated as being significantly larger than second zone airflow 138 to show that first zone fan 128 and second fan 130 have been independently controlled to provide a larger air flow through first zone 124 due to the fact that more blades are present in the first zone than in second zone 126.

In the illustrated configuration, first and second power supplies 142, 148 are provided with first and second power supply fans 144, 150 which draw air from first zone 124 and second zone 126, respectively, through power supplies 142, 148 to create first and second power supply output air flows 146, 152. As illustrated, first power supply output air flow 146 is larger than second power supply output air flow 152 by an amount that is proportional to the amount by which first zone air flow 136 is larger than second zone air flow 138. In this case, the speeds of second zone fan 130 and second power supply fan 150 have been controlled in coordination to have a lower speed with respect to first zone fan 128 and first power supply fan 148 based on the fact that there are no blades loaded in second zone 126. The result of this fan control is a zone-based optimization of power and thermal envelope usage by reducing fan speeds in a zone that requires less cooling.

Figure 3:
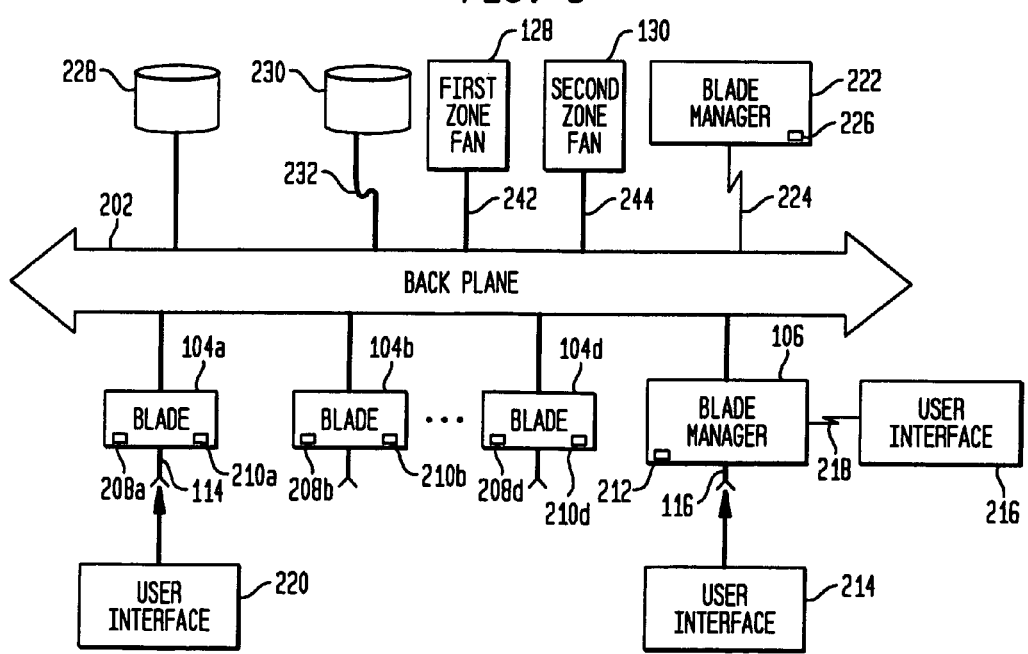
FIG. 3 is a schematic block diagram of the blade system of FIG. 2 illustrating components of the blade system, in accordance with one embodiment of the present invention.

Further details of chassis 132 and blades 104 are illustrated in the diagram of FIG. 2 as well as the functional block diagram of FIG. 3. For example, blades 104a-d slide into chassis 120 and plug into a backplane (not visible in FIG. 2, but illustrated functionally in FIG. 3 with the physical connections made through first and second zone connectors 132, 134 illustrated in FIG. 1). In the illustrated embodiment, a blade manager 106 also slides into chassis 120 and plugs into the backplane (here, the blade manager is one of the blades 104, in particular blade 104d). Blade manager 106 need not be removable, and for purposes of the present invention, need not be located in chassis 120. In addition, blade manager 106 can be connected to, and can control blades in, other chassis over a suitable network link. Each blade 104a-d contains appropriate components 108, 110 and 112, such as processors, memory, network interfaces, disk drives, etc., depending on the blade's intended function. Optionally, each blade 104a-d can include a connector 114, by which a keyboard, video monitor, and mouse (collectively, "KVM") can be connected to the blade to provide a user interface therewith. Similarly, blade manager 106 can include an optional KVM connector 116 to provide a user interface with the blade manager.

As further illustrated in the architectural block diagram of FIG. 3, backplane 202 interconnects components of blade system as blades 104a-d, optionally including blade manager 106, plug into backplane 202. Blade manager 106 communicates over backplane 202 with blade control circuits 208a-d on each of the blades 104a-d, respectively. This communication is preferably carried over a dedicated set of signal lines in backplane 202. Alternatively, this communication can be over shared data lines in backplane 202 or over a signal path separate from the backplane. For example, a separate wired or wireless Ethernet connection can be used. Blade control circuits 208a-208c control availability of power, operation state of processor(s), and other aspects of the blades 104a-d, as is well known in the art. As one example of such control, reference is made to U.S. patent application Ser. No. 10/216,285; entitled "System and Method for Managing the Operating Frequency of Processors or Blades" and filed in August of 2002, which application is hereby incorporated by reference for its teaching of operating frequency monitoring and control in a bladed architecture, as well as the further United States Patent Applications listed as related and incorporated by reference into that application relating to further monitoring and control in a bladed architecture. Blade manager 106 can thus receive a variety of operational parameters relating to the activity of electronic modules such as blades 104 located in first 124 and second 126 zones of electronic system 100, including, but not limited to, the number of electronic modules connected within a zone, the number of electronic modules that are operating within the zone, the operational frequency of any electronic modules connected within the zone, the voltage of any electronic modules connected within the zone, and the power consumed by any electronic modules connected within the zone, the temperature of the electronic module or of a particular processor or other component, and combinations of these operating parameters. These parameters can be received dynamically or periodically.

Each blade 104a-d includes an EE-PROM 210a-d, respectively, or other type of persistent memory to store configuration information for the blade. Any type of persistent memory that retains its contents without the availability of power can be used. The configuration information can include, for example, serial number and license information, as well as other blade identification or configuration information. The following discussion is presented in the context of blade 104a. Unless otherwise noted, the following description applies to any blade 104a-d.

Blade manager 106 also includes an EE-PROM 212 or other type of persistent memory. The blade manager's persistent memory need not be co-located with blade manager 106, as long as the persistent memory is accessible to blade manager. For example, the persistent memory can be a disk drive and/or it can be located elsewhere in chassis 122. Alternatively, the blade manager's persistent memory can be made up of several parts, each in a different location. Alternatively, blade managers 222 of several blade systems 100 can share a common persistent memory that is suitably connected to the blade managers. In the following discussion, persistent memory 212 will be referred to herein as EE-PROM 212 for simplicity, but the discussion applies to any form of persistent memory.

As noted, a user interface 214 can be connected to blade manager 106 via the connector 116. Alternatively, a remote user interface 216 can be connected to blade manager 106 via a network link or other suitable connection 218. In the following discussion, reference to user interface 214 also applies to user interface 216. Optionally, a user interface 220 can connect to blade 104a via connector 114. Alternatively, user interface 214 or 216 can communicate with blade 104a. In this case, blade manager 106 relays commands and responses to and from blade 104a over backplane 202.

As discussed above, blade manager 106 need not be located within blade system 100. For example, remote blade manager 222 can communicate with blade system 100 over a communication link 224. Such a communication link 224 can be provided by, for example, a wire or wireless local area network (LAN). As with blade manager 106, remote blade manager 222 includes an EE-PROM or other suitable persistent memory 226 and can have a directly-connected or remote user interface (not shown), similar to the user interfaces 214 and 216. As discussed above, blade manager 106 can communicate with and control blades in another chassis via a communication link 224. The following discussion refers to blade manager 106. However, unless otherwise noted, the following discussion also applies to remote blade manager 222.

Disk drives, such as local disk drive 228 or remote disk drive 230, can be connected to backplane 202. Remote disk drive 230 can be connected to backplane 202 via a suitable network connection 232, as is well know in the art.

In addition, first and second zone fans 128, 130 can receive independent control signals 242, 244 from blade manager 106 through backplane 202 or by another connection known in the art. Control signals 242, 244 are calculated (for example by using a policy management system having policies regarding fan operation) by blade manager 106 based upon the presence and optionally the operating characteristics of any blades 104 present in a particular zone. In one embodiment, the speed of first and second zone fans 128, 130 is established using pulse width modulation as is known in the art, and control signals 242, 244 are indicative of the pulse width to be employed and thus the speed of the fans in the separate zones. First and second power supply fans 144, 150 can be independently controlled by blade manager 106 in much the same way as first and second zone fans 128, 130 are, or they can share a control signal with the first and second zone fans—for example, control signal 242 could be shared by first zone fan 128 and first power supply fan 144 and control signal 244 could be shared by second zone fan 130 and second power supply fan 150.

The invention may also be embodied in a method for cooling an electronic system having a module manager and a plurality of replaceable electronic modules provided in a plurality of zones with each zone having an independently controllable cooling fan. In this embodiment, the module manager receives one or more operational parameters from each of a first and second zone of the electronic system. The module manager then calculates a desired speed for a first zone cooling fan and provides a control signal indicating the desired speed to the first zone cooling fan associated with the first zone, and calculates a desired speed for the second zone cooling fan and provides a control signal indicating the desired speed to the second zone cooling fan associated with the second zone. In this embodiment, each of the other features of the invention described above may be employed.

Embodiments have been described in which the present invention is employed in a blade system to automatically or dynamically manage cooling fans in different zones. However, one of ordinary skill in the art can apply the teachings herein to systems having other types of electronic modules. For example, rack mounted servers or other rack mounted electronic components can have fans in different zones. Such rack mounted components often include control circuitry on each component that monitors and controls local operating conditions, typically in communication with a dedicated controller or workstation running monitoring and control software such as that available from Hewlett-Packard Co. under the name OpenView. Such a system could readily be adapted to utilize the present invention.

The terms and expressions employed herein are used as terms of description, not of limitation. There is no intention, in using these terms and expressions, to exclude any equivalents of the features shown or described or portions thereof. Practitioners in the art will recognize that other modifications are possible within the scope of the invention claimed.

What is claimed is:

1. A method for cooling an electronic system having a module manager and a plurality of replaceable electronic modules provided in a plurality of zones with each zone having an independently controllable cooling fan, comprising:
   receiving by the module manager one or more operational parameters from a first zone of the electronic system, wherein the received operational parameters comprise a voltage of any electronic modules connected within the first zone;
   receiving by the module manager one or more operational parameters from a second zone of the electronic system, wherein the received operational parameters comprise a voltage of any electronic modules connected within the second zone;
   calculating by the module manager a desired speed from a cooling fan associated with the first zone of the electronic system based on the received voltage(s) of the electronic module(s) connected within the first zone, and providing a control signal indicating the desired speed to the cooling fan associated with the first zone; and
   calculating by the module manager a desired speed for a cooling fan associated with the second zone of the electronic system based on the received voltage(s) of the electronic module(s) connected within the second zone, and providing a control signal indicating the desired speed to the cooling fan associated with the second zone.

2. The method of claim 1, wherein the calculated speed of the first zone fan is different than the calculated speed of the second zone fan.

3. The method of claim 1, wherein the first zone further has a second first zone fan and the second zone further has a second zone fan.

4. The method of claim 3, wherein the second first zone fan and the second zone fan are each associated with a power supply module.

5. The method of claim 4, wherein the power supply module associated with the second first zone fan provides power to any electronic modules connected within the first zone and the power supply module associated with the second zone fan provides power to any electronic modules connected in the second zone.

6. The method of claim 3, wherein the first zone fan speed and the second first zone fan speed is coordinated to result in a desired cooling of any electronic modules connected in the first zone.

7. The method of claim 6, wherein the first zone fan and the second first zone fan share a common control signal.

8. The method of claim 1, wherein the operational parameters received by the module manager for a given zone also include the number of replaceable electronic modules connected within the respective first and second zones.

9. The method of claim 1, wherein the operational parameters received by the module manager for a given zone also include the number of replaceable electronic modules that are operating within the respective first and second zones.

10. The method of claim 1, wherein the operational parameters received by the module manager for a given zone include also the operational frequency of any replaceable electronic modules connected within the respective first and second zones.

11. The method of claim 1, wherein the operational parameters received by the module manager for a given zone also include the power consumed by any replaceable electronic modules connected within the respective first and second zones.

12. The method of claim 1, wherein the first and second zones are located within a chassis.

13. The method of claim 12, wherein the chassis includes a backplane having the first and second zone connectors.

14. The method of claim 13, wherein the chassis is provided within a rack which carries the first and second zone fans and at least one power supply module.

15. The method of claim 1, wherein the electronic system employs a bladed architecture.

16. The method of claim 1 further comprising the module manager receiving updated operational parameters and adjusting the speed of the first and second zone fans.

17. A method for cooling an electronic system having a module manager and a plurality of replaceable electronic modules provided in a plurality of zones with each zone having an independently controllable cooling fan, comprising:
   receiving by the module manager one or more operational parameters from a first zone of the electronic system, wherein the received operational parameters comprise the number of any electronic modules connected within the first zone;
   receiving by the module manager one or more operational parameters from a second zone of the electronic system, wherein the received operational parameters comprise the number of any electronic modules connected within the second zone;
   calculating by the module manager a desired speed from a cooling fan associated with the first zone of the electronic system based on the received number of the electronic module(s) connected within the first zone, and providing a control signal indicating the desired speed to the cooling fan associated with the first zone; and
   calculating by the module manager a desired speed for a cooling fan associated with the second zone of the electronic system based on the received number of the electronic module(s) connected within the second zone, and providing a control signal indicating the desired speed to the cooling fan associated with the second zone.

18. A method for cooling an electronic system having a module manager and a plurality of replaceable electronic modules provided in a plurality of zones with each zone having an independently controllable cooling fan, comprising:
receiving by the module manager one or more operational parameters from a first zone of the electronic system, wherein the received operational parameters comprise the number of any electronic modules operating within the first zone;
receiving by the module manager one or more operational parameters from a second zone of the electronic system, wherein the received operational parameters comprise the number of any electronic modules operating within the second zone;
calculating by the module manager a desired speed from a cooling fan associated with the first zone of the electronic system based on the received number of the electronic module(s) operating within the first zone, and providing a control signal indicating the desired speed to the cooling fan associated with the first zone; and
calculating by the module manager a desired speed for a cooling fan associated with the second zone of the electronic system based on the received number of the electronic module(s) operating within the second zone, and providing a control signal indicating the desired speed to the cooling fan associated with the second zone.

19. A method for cooling an electronic system having a module manager and a plurality of replaceable electronic modules provided in a plurality of zones with each zone having an independently controllable cooling fan, comprising:
receiving by the module manager one or more operational parameters from a first zone of the electronic system, wherein the received operational parameters comprise an operational frequency of any electronic modules connected within the first zone;
receiving by the module manager one or more operational parameters from a second zone of the electronic system, wherein the received operational parameters comprise an operational frequency of any electronic modules connected within the second zone;
calculating by the module manager a desired speed from a cooling fan associated with the first zone of the electronic system based on the received operational frequency of the electronic module(s) connected within the first zone, and providing a control signal indicating the desired speed to the cooling fan associated with the first zone; and
calculating by the module manager a desired speed for a cooling fan associated with the second zone of the electronic system based on the received operational frequency of the electronic module(s) connected within the second zone, and providing a control signal indicating the desired speed to the cooling fan associated with the second zone.

20. A method for cooling a blade architecture system having a blade manager and a plurality of replaceable blades connected within a plurality of zones of a chassis and wherein each zone has an independent controllable cooling fan, comprising:
receiving by the blade manager one or more operational parameters from a first zone of the electronic system;
receiving by the blade manager one or more operational parameters from a second zone of the electronic system;
calculating by the blade manager a desired speed from a cooling fan associated with the first zone of the electronic system based on the received operational parameters for the first zone, and providing a control signal indicating the desired speed to the cooling fan associated with the first zone;
calculating by the blade manager a desired speed for a cooling fan associated with the second zone of the electronic system based on the received operational parameters for the second zone, and providing a control signal indicating the desired speed to the cooling fan associated with the second zone;
managing by the blade manager one or more of the blades connected within the plurality of zones;
and
establishing by the blade manager one or more logical connections between the blades.

21. The method of claim 20, wherein the blade manager is embodied on a blade connected within one of the plurality of zones.

22. The method of claim 20, wherein the blade manager is embodied on a blade located outside the chassis.

23. The method of claim 20, further comprising:
managing by the blade manager one or more blades located in a separate chassis.

24. The method of claim 20, wherein the operational parameters received by the blade manager for a given zone include the number of blades that are connected within the given zone.

25. The method of claim 20, wherein the operational parameters received by the blade manager for a given zone include the number of blades that are operating within the given zone.

26. The method of claim 20, wherein the operational parameters received by the blade manager for a given zone include the operational frequency of one or more blades connected within the given zone.

27. The method of claim 20, wherein the operational parameters received by the blade manager for a given zone include the voltage of any blades connected within the given zone.

28. The method of claim 20, wherein the operational parameters received by the blade manager for a given zone include one or more of the power consumed by any blades connected within the given zone, and the thermal envelope associated with each slot in the chassis and/or each individual blade that plugs into the chassis.

* * * * *

UNITED STATES PATENT AND TRADEMARK OFFICE
CERTIFICATE OF CORRECTION

| | |
|---|---|
| PATENT NO. | : 8,597,091 B2 |
| APPLICATION NO. | : 11/191052 |
| DATED | : December 3, 2013 |
| INVENTOR(S) | : Ricardo Espinoza-Ibarra et al. |

It is certified that error appears in the above-identified patent and that said Letters Patent is hereby corrected as shown below:

In the Claims:

In column 8, line 23, in Claim 10, delete "include also" and insert -- also include --, therefor.

Signed and Sealed this
Twenty-fifth Day of March, 2014

Michelle K. Lee
*Deputy Director of the United States Patent and Trademark Office*